United States Patent
Hatanaka et al.

(10) Patent No.: US 11,176,888 B2
(45) Date of Patent: Nov. 16, 2021

(54) AUTO-ZERO APPLIED BUFFER FOR DISPLAY CIRCUITRY

(71) Applicant: Apple Inc., Cupertino, CA (US)

(72) Inventors: Shingo Hatanaka, San Jose, CA (US); Derek Keith Shaeffer, Redwood City, CA (US); John T. Wetherell, San Jose, CA (US); Nobutaka Shimamura, Kawasaki (JP); Yuichi Okuda, Saitama (JP); Jaeyoung Kang, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/905,895

(22) Filed: Jun. 18, 2020

(65) Prior Publication Data

US 2021/0056904 A1 Feb. 25, 2021

Related U.S. Application Data

(60) Provisional application No. 62/890,520, filed on Aug. 22, 2019.

(51) Int. Cl.
*G09G 3/3258* (2016.01)
*H03F 3/30* (2006.01)

(52) U.S. Cl.
CPC .......... *G09G 3/3258* (2013.01); *H03F 3/304* (2013.01); *G09G 2310/0289* (2013.01); *G09G 2310/0291* (2013.01)

(58) Field of Classification Search
CPC ......... G09G 3/3258; G09G 2310/0289; G09G 2310/0291; H03F 3/304

USPC ......................................................... 345/55
See application file for complete search history.

(56) References Cited

U.S. PATENT DOCUMENTS

| | | | |
|---|---|---|---|
| 6,426,676 B1 * | 7/2002 | Kuijk ................... | H03F 3/45076 330/252 |
| 7,443,374 B2 | 10/2008 | Hudson | |
| 7,719,351 B2 | 5/2010 | Pertijs et al. | |
| 2007/0159250 A1 * | 7/2007 | Tsuchi ................ | H03F 3/45233 330/253 |
| 2008/0246543 A1 * | 10/2008 | Trifonov ............. | H03F 3/45192 330/253 |
| 2009/0195533 A1 * | 8/2009 | Chen .................... | G09G 3/3655 345/214 |
| 2011/0080214 A1 * | 4/2011 | Tsuchi ................ | G09G 3/3688 330/69 |
| 2012/0127138 A1 * | 5/2012 | Tsuchi ................ | G09G 3/3677 345/204 |

(Continued)

*Primary Examiner* — Tom V Sheng
(74) *Attorney, Agent, or Firm* — Fletcher Yoder, P.C.

(57) ABSTRACT

A system includes a pixel that emits light based on a signal provided to the pixel. The system may also include a buffer circuit having a differential pair stage, a cascade stage, and an output stage. The differential pair stage may receive a common mode voltage signal via a first switch in response to the first switch receiving a first signal that causes the first switch to close. The differential pair stage may couple a capacitor to the output stage via a second switch that operate based on a second signal, such that the capacitor reduces an offset provided by one or more circuit components in the differential pair stage, the cascade stage, the output stage, or any combination thereof. The differential pair stage may output the common mode voltage to the pixel via the output stage in response to the first signal being present.

20 Claims, 15 Drawing Sheets

(56) References Cited

U.S. PATENT DOCUMENTS

| | | | |
|---|---|---|---|
| 2013/0088473 A1* | 4/2013 | Tsuchi | H03F 3/45076 345/211 |
| 2015/0035813 A1* | 2/2015 | Lei | H03F 3/393 345/205 |
| 2018/0262374 A1* | 9/2018 | Cheng | H03F 3/193 |
| 2020/0020282 A1* | 1/2020 | Chou | G09G 3/3291 |

* cited by examiner

US 11,176,888 B2

AUTO-ZERO APPLIED BUFFER FOR DISPLAY CIRCUITRY

CROSS-REFERENCE TO RELATED APPLICATIONS

This application claims priority to U.S. Provisional Patent Application No. 62/890,520, filed on Aug. 22, 2019 and entitled "AUTO-ZERO APPLIED BUFFER FOR DISPLAY CIRCUITRY," the entirety of which is incorporated by reference herein in its entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates generally to electronic displays and, more particularly, to improving continuous buffering in the electronic displays, while resolving offset issues due to using certain circuit components in the electronic display.

Electronic devices often use electronic displays to present visual representations of information as text, still images, and/or video by displaying one or more image frames. For example, such electronic devices may include computers, mobile phones, portable media devices, tablets, televisions, virtual-reality headsets, vehicle dashboards, and wearable devices, among many others. To accurately display an image frame, an electronic display may control light emission (e.g., luminance) from its display pixels. Between frames of image data, display driver circuitry of electronic displays may utilize certain techniques and circuitry to remove offsets that are present in the display panel circuitry (e.g., switching devices). Present techniques to remove these offsets involve a certain amount of circuitry and power to continuously operate the display. However, reducing the amount of circuitry and power used in removing these offsets may allow electronic displays to use power more efficiently, while producing more accurate image data.

Keeping this in mind, this disclosure relates to employing an auto-zero circuit topology that minimizes offsets present in certain circuit components (e.g., switches) used in display circuitry to produce image data on an electronic display. Electronic displays are found in numerous electronic devices, from mobile phones to computers, televisions, automobile dashboards, and many more. Individual pixels of the electronic display may collectively produce images by permitting different amounts of light to be emitted from each pixel based on image data provided to a display driver circuit. The light emitted from each pixel may occur by self-emission as in the case of light-emitting diodes (LEDs), such as organic light-emitting diodes (OLEDs), or by selectively providing light from another light source as in the case of a digital micromirror device (DMD) or liquid crystal display (LCD).

Prior to providing the pixel data to pixel circuitry in a display panel, the pixel data may be transmitted to a buffer circuit. As the refresh rates of display panels continue to increase, the buffers are continuously receiving pixel data (e.g., voltage). The buffer circuit may include various circuit components (e.g., switches, operational amplifiers) that may apply an offset to the received pixel data. To ensure that the light emitted on pixels of a display panel in an electronic display accurately reflects the image data provided to the display driver, certain auto-zeroing techniques or circuitry are used to minimize the offsets applied in the buffer circuit. For example, offset corrections are performed by using a factory calibration process, employing chopping circuitry, using a periodic auto-zero assertion, and the like. Although each of these methods may assist in reducing the offsets applied to the pixel data, each of these methods have certain respective drawbacks.

For instance, employing a factory calibration process may increase the time and costs involved in manufacturing displays. In addition, to store the results of the factory calibration process, valuable memory space may be used within the display circuitry. In addition to the memory space limitation, the factory calibration process may not account for offset drifts that occur due to changes in temperature and other ambient operating conditions surrounding the electronic display.

While chopping techniques may remove offsets temporally by switching between two opposites states of condition, thereby canceling the offset drifts present in the circuit components, the chopping techniques may be less effective when the display panel is operating at lower refresh rates or frequencies. In addition, the periodic and frequent clocking used to switch between the two states may cause kickbacks and disturbances to the input signal, thereby reducing the accuracy of the pixel data input to the buffer circuit.

Auto-zero assertions may involve circuit components (e.g., switches) that leak current and thus makes it difficult to preserve offset signals for certain amounts of time. Moreover, by employing a frequent auto-zero assertion, the circuitry performing the auto-zero assertion draws additional power that may be an inefficient way to operate the display panel.

With the foregoing in mind, the present embodiments described herein may involve arranging circuit components in a particular manner to resolve the offset issues described above. That is, in certain embodiments, during an auto-zero phase of operation (e.g., during vertical blanking interval), switching devices may close to connect capacitors coupled to a voltage source (e.g., VDD) to cascade stage circuitry of the buffer circuit to control the voltage output to pixel circuity. The leakage current of the switches may be minimized by positioning the capacitors, such that they feed differential pair devices. The switching devices may store the correction voltages on the capacitors, while the capacitors absorb any error current from the differential pair and the cascade stage circuitry. As a result, the switching devices and capacitors may preserve the offset correction properties described in the other techniques described above over a longer period of time, as compared to the techniques described above. Additional details with regard to employing an auto-zero applied buffer with display circuitry will be described below with reference to FIGS. 1-18.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments are described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Embodiments of the present disclosure relate to systems and methods that improve the accuracy of image data depicted on electronic display. Electronic displays may include light-modulating pixels, which may be light-emitting in the case of light-emitting diode (LEDs), such as organic light-emitting diodes (OLEDs), but may selectively provide light from another light source as in the case of a digital micromirror device (DMD) or liquid crystal display (LCD). While this disclosure generally refers to self-emissive displays, it should be appreciated that the systems and methods of this disclosure may also apply to other forms of electronic displays that use signals which values change at an undesirable slow transition rate, and should not be limited to self-emissive displays. When the electronic display is a self-emissive display, an OLED represents one type of LED that may be found in a self-emissive pixel, but other types of LEDs may also be used.

Figure 1:
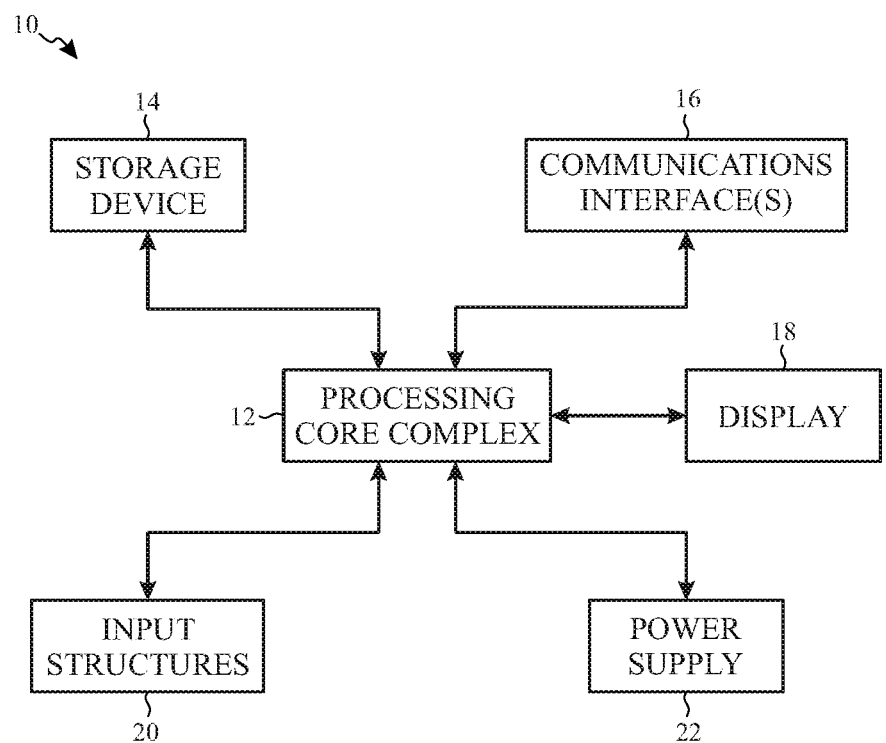
FIG. 1 is a schematic block diagram of an electronic device, in accordance with an embodiment.

A general description of suitable electronic devices that may include a self-emissive display, such as a LED (e.g., an OLED) display, and corresponding circuitry of this disclosure are provided below with reference to FIG. 1. FIG. 1 is a block diagram of one example of a suitable electronic device 10 may include, among other things, a processing core complex 12 such as a system on a chip (SoC) and/or processing circuit(s), a storage device 14, communication interface(s) 16, a display 18, input structures 20, and a power supply 22. The blocks shown in FIG. 1 may each represent hardware, software, or a combination of both hardware and software. The electronic device 10 may include more or fewer elements. It should be appreciated that FIG. 1 merely provides one example of a particular implementation of the electronic device 10.

The processing core complex 12 of the electronic device 10 may perform various data processing operations, including generating and/or processing image data for presentation on the display 18, in combination with the storage device 14. For example, instructions that are executed by the processing core complex 12 may be stored on the storage device 14. The storage device 14 may be volatile and/or non-volatile memory. By way of example, the storage device 14 may include random-access memory, read-only memory, flash memory, a hard drive, and so forth.

The electronic device 10 may use the communication interface(s) 16 to communicate with various other electronic devices or elements. The communication interface(s) 16 may include input/output (I/O) interfaces and/or network interfaces. Such network interfaces may include those for a personal area network (PAN) such as Bluetooth, a local area network (LAN) or wireless local area network (WLAN) such as Wi-Fi, and/or for a wide area network (WAN) such as a cellular network.

Using pixels containing LEDs (e.g., OLEDs), the display 18 may show images generated by the processing core complex 12. The display 18 may include touchscreen functionality for users to interact with a user interface appearing on the display 18. Input structures 20 may also enable a user to interact with the electronic device 10. In some examples, the input structures 20 may represent hardware buttons, which may include volume buttons or a hardware keypad. The power supply 22 may include any suitable source of power for the electronic device 10. This may include a battery within the electronic device 10 and/or a power conversion device to accept alternating current (AC) power from a power outlet.

Figure 2:
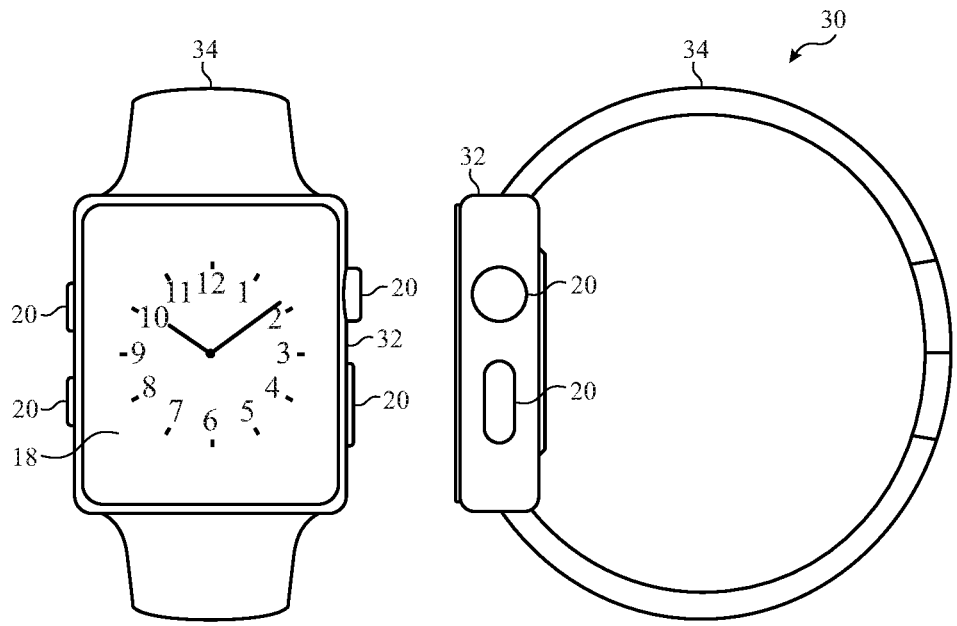
FIG. 2 is a perspective view of a watch representing an embodiment of the electronic device of FIG. 1, in accordance with an embodiment.

As may be appreciated, the electronic device 10 may take a number of different forms. As shown in FIG. 2, the electronic device 10 may take the form of a watch 30. For illustrative purposes, the watch 30 may be any Apple Watch® model available from Apple Inc. The watch 30 may include an enclosure 32 that houses the electronic device 10 elements of the watch 30. A strap 34 may enable the watch 30 to be worn on the arm or wrist. The display 18 may display information related to the watch 30 operation, such as the time. Input structures 20 may enable a person wearing the watch 30 to navigate a graphical user interface (GUI) on the display 18.

Figure 3:
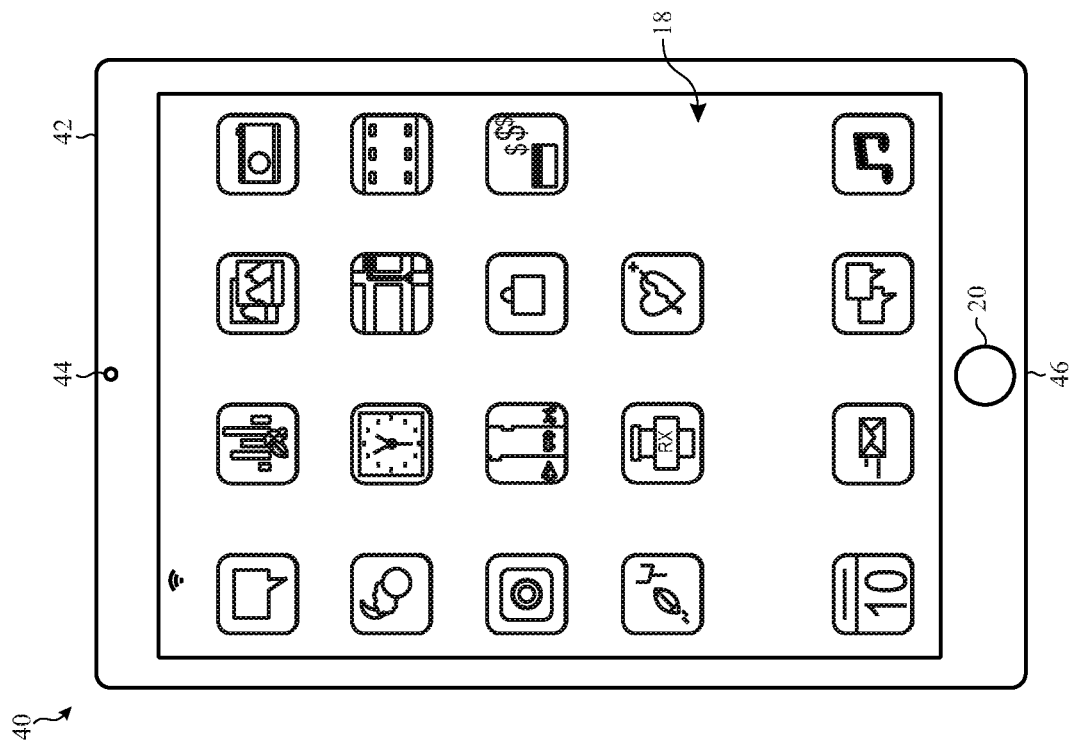
FIG. 3 is a front view of a tablet device representing an embodiment of the electronic device of FIG. 1, in accordance with an embodiment.

The electronic device 10 may also take the form of a tablet device 40, as is shown in FIG. 3. For illustrative purposes, the tablet device 40 may be any iPad® model available from Apple Inc. Depending on the size of the tablet device 40, the tablet device 40 may serve as a handheld device such as a mobile phone. The tablet device 40 includes an enclosure 42 through which input structures 20 may protrude. In certain examples, the input structures 20 may include a hardware keypad (not shown). The enclosure 42 also holds the display 18. The input structures 20 may enable a user to interact with a GUI of the tablet device 40. For example, the input structures 20 may enable a user to type a Rich Communication Service (RCS) message, a Short Message Service (SMS) message, or make a telephone call. A speaker 44 may output a received audio signal and a microphone 46 may capture the voice of the user. The tablet device 40 may also include a communication interface 16 to enable the tablet device 40 to connect via a wired connection to another electronic device.

Figure 4:
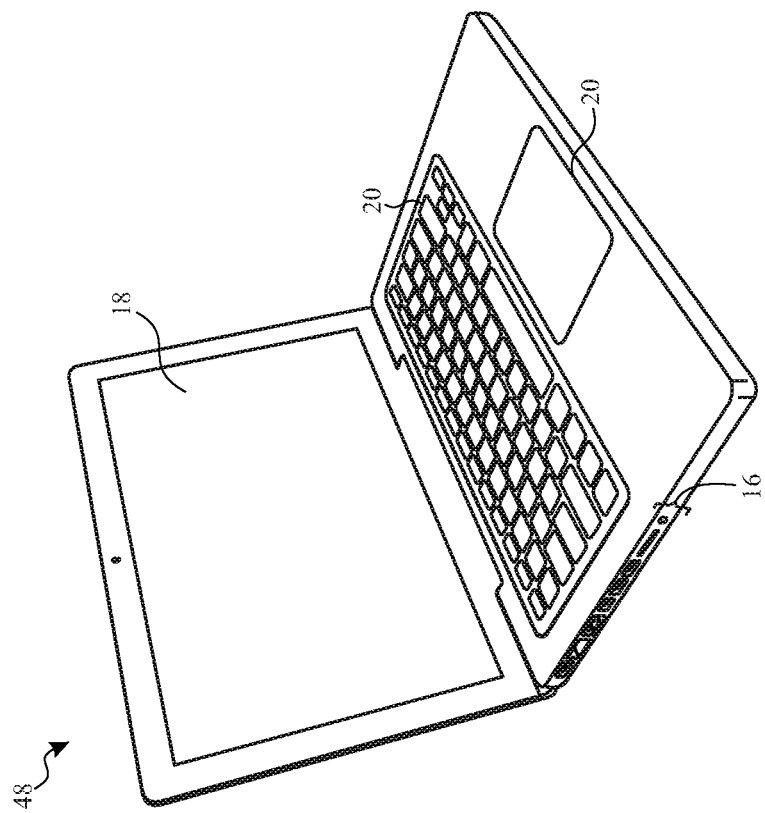
FIG. 4 is a front view of a computer representing an embodiment of the electronic device of FIG. 1, in accordance with an embodiment.

A computer 48 represents another form that the electronic device 10 may take, as shown in FIG. 4. For illustrative purposes, the computer 48 may be any Macbook® or iMac® model available from Apple Inc. It should be appreciated that the electronic device 10 may also take the form of any other computer, including a desktop computer. The computer 48 shown in FIG. 4 includes the display 18 and input structures 20, such as in the form of a keyboard and a track pad. Communication interfaces 16 of the computer 48 may include, for example, a universal serial bus (USB) connection.

Figure 5:
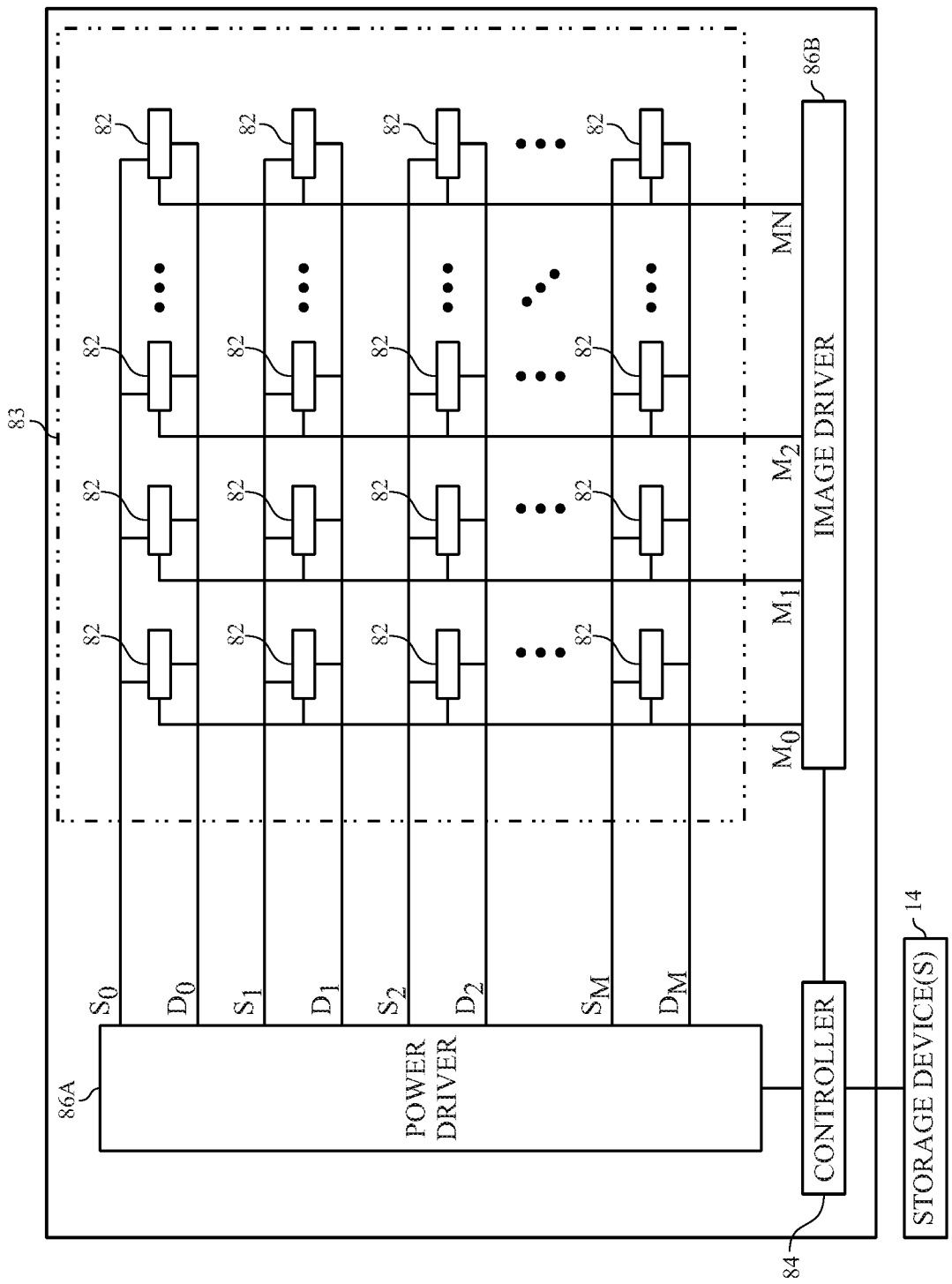
FIG. 5 is a circuit diagram of the display of the electronic device of FIG. 1, in accordance with an embodiment.

The display 18 may include a pixel array having an array of one or more pixels 82 within an active area 83. The display 18 may include any suitable circuitry to drive the pixels 82. In the example of FIG. 5, the display 18 includes a controller 84, a power driver 86A, an image driver 86B, and the array of the pixels 82. The power driver 86A and image driver 86B may drive individual of the pixels 82. In some cases, the power driver 86A and the image driver 86B may include multiple channels for independent driving of multiple pixels 82. Each of the pixels 82 may include any suitable light-emitting element, such as a LED, one example of which is an OLED. However, any other suitable type of pixel may also be used. Although the controller 84 is shown in the display 18, the controller 84 may sometimes be located outside of the display 18. For example, the controller 84 may be at least partially located in the processing core complex 12.

The scan lines S0, S1, ..., and Sm and driving lines D0, D1, ..., and Dm may connect the power driver 86A to the pixel 82. The pixel 82 may receive on/off instructions through the scan lines S0, S1, ..., and Sm and may receive programming voltages corresponding to data voltages transmitted from the driving lines D0, D1, ..., and Dm. The programming voltages may be transmitted to each of the pixel 82 to emit light according to instructions from the image driver 86B through driving lines M0, M1, ..., and Mn. Both the power driver 86A and the image driver 86B may transmit voltage signals as programmed voltages (e.g., programming voltages) through respective driving lines to operate each pixel 82 of an active area 83 at a state determined by the controller 84 to emit light. Each driver 86 may supply voltage signals at a duty cycle and/or amplitude sufficient to operate each pixel 82.

The intensities of each pixel 82 may be defined by corresponding image data that defines particular gray levels for each of the pixels 82 to emit light. A gray level indicates a value between a minimum and a maximum range, for example, 0 to 255, corresponding to a minimum and maximum range of light emission. Causing the pixels 82 to emit light according to the different gray levels causes an image to appear on the display 18. In this way, a first brightness level of light (e.g., at a first luminosity and defined by a gray level) may emit from a pixel 82 in response to a first value of the image data and the pixel 82 may emit at a second brightness level of light (e.g., at a first luminosity) in response to a second value of the image data. Thus, image data may facilitate creating a perceivable image output by indicating light intensities to be generated via a programmed data signal to be applied to individual pixels 82.

The controller 84 may retrieve image data stored in the storage device 14 indicative of various light intensities. In some examples, the processing core complex 12 may provide image data directly to the controller 84. The controller 84 may control the pixel 82 by using control signals to control elements of the pixel 82. The pixel 82 may include any suitable controllable element, such as a transistor, one example of which is a metal-oxide-semiconductor field-effect transistor (MOSFET). However, any other suitable type of controllable elements, including thin film transistors (TFTs), p-type and/or n-type MOSFETs, and other transistor types, may also be used.

The controller 84 may use a driving signal (e.g., programming voltage, programming current) and transmitted control signals to control the luminance, also sometimes referred to as brightness, of light (Lv) emitted from the pixel 82. It should be noted that luminance and brightness are terms that refer to an amount of light emitted by a pixel 82 and may be defined using units of nits (e.g., candela/m$^2$) or using units of lumens. The driving signal may be selected by a controller 84 to cause a particular luminosity of light emission (e.g., brightness level of light emitted, measure of light emission) from a light-emitting diode (LED) (e.g., an organic light-emitting diode (OLED)) of the self-emissive pixel 82 or other suitable light-emitting element.

In some embodiments, the power driver 86A and/or the image driver 86B may include circuitry used to output the driving signals. This circuitry may include an auto-zero applied buffer circuit to reduce the offsets that may be applied to input data voltages received by a buffer circuit prior to outputting the data voltages to the pixels 82.

Figure 6:
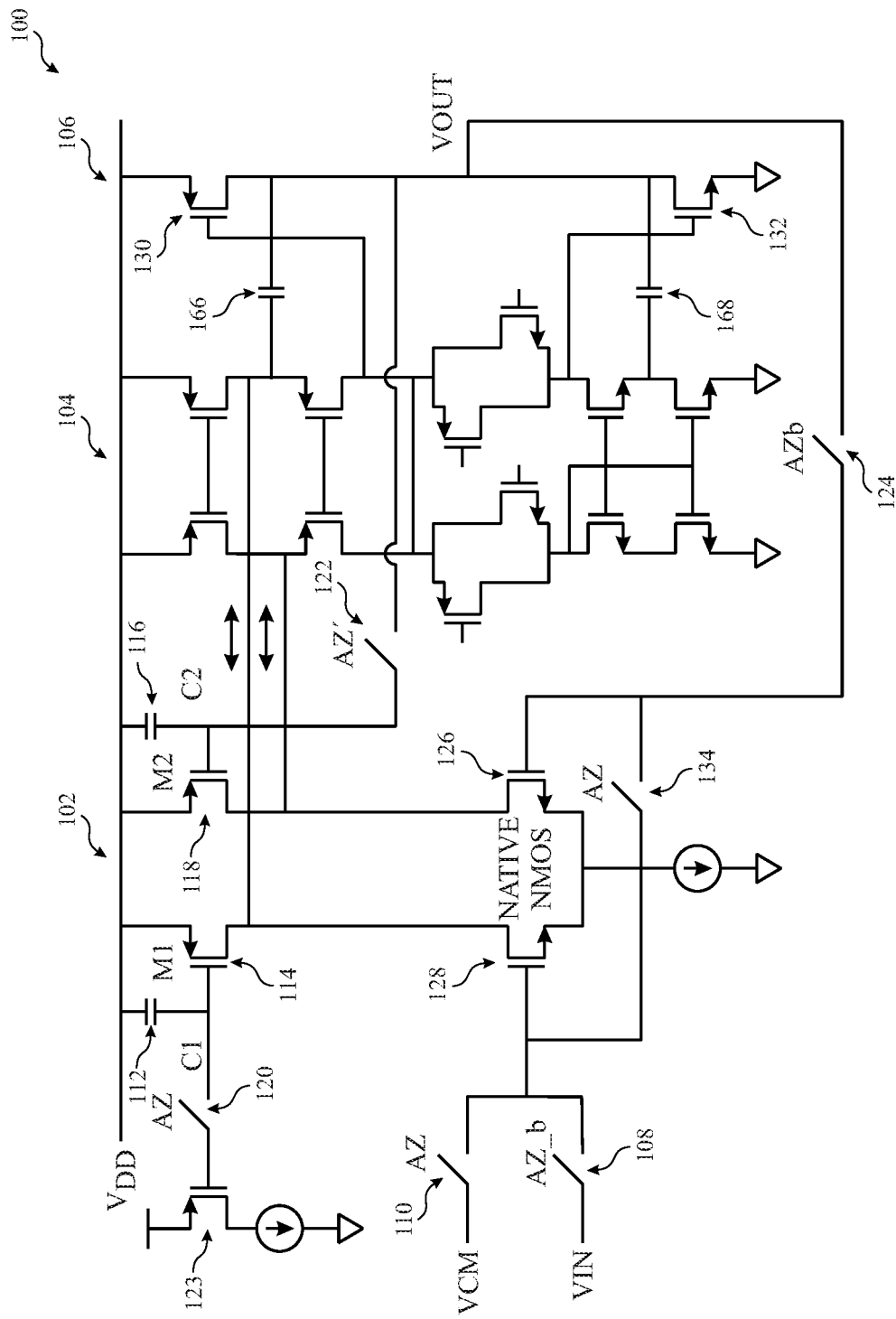
FIG. 6 is a circuit diagram of a buffer circuit that may be part of the display of FIG. 5, in accordance with an embodiment.

By way of example, FIG. 6 illustrates a buffer circuit 100 that includes a differential pair stage 102, a cascade stage 104, and an output stage 106. The differential pair stage 102 may receive pixel data input (VIN) via switch 108 when buffering input pixel data for output to the pixel 82 via the output stage 106. The differential pair stage 102 may also receive a common mode voltage (VCM) via switch 110, which may operate inversely as compared to switch 108. That is, when the switch 108 is closed, the switch 110 may be open, and vice-versa.

The differential pair stage 102 may also include a capacitor 112 coupled to a gate of a switch 114 and a capacitor 116 coupled to a gate of a switch 118. The switches 114 and 118 may be a metal-oxide-semiconductor field-effect transistor (MOSFET), metal-insulator-metal (MIM) transistor, or any other suitable switching device. In addition, the differential pair stage 102 may also include switch 120 and switch 122. It should be noted that the pair of switches 114 and 118 may be similarly sized. In the same way, the pair of switches 120 and 122 and the pair of capacitors 112 and 116 may be similarly sized to minimize the error between each leg of the differential pair stage 102. In addition, the differential pair stage 102 may include a switch 123 that may be coupled to the voltage source (VDD), such that the gate of the switch 123 may be coupled to the capacitor 112. In some embodiments, the switches 114, 118, 120, 122, 123 and the capacitors 112 and 116 may be considered part of an auto-zero stage circuit for the buffer circuit 100.

When buffering the input pixel data, the differential pair stage 102 may amplify the difference between the voltage previously output by via the output stage 106 to the pixel 82 (e.g., via switch 124) and the input voltage (VIN) currently being provided to the buffer circuit 100 (e.g., via switch 108) for output via the output stage 106. The previously output voltage is provided to the gate of switch 126 of the differential pair stage 102, while the input voltage (VIN) is provided to the gate of switch 130 of the differential pair stage 102. The amplified difference in current due to the difference in driving the switches 128 and 126 may be provided to the cascade stage 104, which may increase the strength of the signal associated with the amplified difference to drive the output stage 106. That is, for example, if the amplified difference output by the differential pair stage 102 is indicative of a voltage change from negative (e.g., low) to positive (e.g., high), the cascade stage 104 may increase the strength of the positive signal by driving a gate of a PMOS switch 130 of the output stage 106. In the same manner, if the amplified difference output by the differential pair stage 102 is indicative of a voltage change from a high voltage to a lower voltage, the cascade stage 104 may increase the strength of the low voltage signal by driving a gate of an NMOS switch 132 of the output stage 106.

Keeping this in mind, it should be noted that the differential pair stage 102 may apply an offset to the amplified difference due to various properties of the circuit components in the buffer circuit 100, ambient conditions surrounding the display 18, and the like. To reduce the offset applied by the differential pair stage 102, an auto-zero phase of operation may be performed during a vertical blanking interval between frames of image data. By way of operation, during the auto-zero phase, the switch 110 may be closed (e.g., operate according to AZ clock signal) and the switch 108 may be opened (e.g., operate according to AZ_b clock signal). In addition, switch 134 may also be closed synchronously with the switch 110 (e.g., operate according to AZ clock signal). As such, the switches 128 and 126 of the differential pair stage 102 are each provided with a common mode voltage (VCM) that may be used to reset the voltage output via the output stage 106.

Just prior to closing the switches 110, 120, and 134, the switch 122 may be closed (e.g., operate according to AZ' clock signal). As such, the capacitor 116 is coupled to the output stage 106 via the switch 122. Since the differential pair stage 102 is coupled to the cascade stage 104 via the switches 114 and 118, offset error currents from the cascade stage 104 are provided back to the differential pair stage 102 and stored on the capacitors 112 and 116. In this way, the capacitors 112 and 116 absorb error currents due to offsets provided by circuit components in the differential pair stage 102, the cascade stage 104, and the output stage 106. Since the voltages at the switches 120 and 122 are close to the same voltage value after the switches 120 and 122 are opened during the buffering operation phase of the buffer circuit 100, the leakage current associated with the capacitors 112 and 116 is minimal. Moreover, since the gate voltage provided to the switches 114 and 118 are closely coupled to the voltage rail (VDD), the leakage current in the switches 114 and 118 is also minimal. As such, the correction charge operations of the auto-zero phase of operation is preserved for a longer period of operational time, as compared to the other methods for reducing offset bias mentioned above.

Moreover, since the feedback current paths via switches 120 and 122 are provided through PMOS switches of the cascade stage 104, the common mode input range of the differential pair stage 102 may be widened. In addition, by employing NMOS switches 128 and 126 in conjunction with the PMOS switches 114 and 118 in the differential pair, the common mode input range may also be maximized as a rail-to-rail input range (e.g., VDD to ground as per FIG. 6).

It should be noted that the arrangement of the switches 114, 118, 120, 122, and 123 of the buffer circuit 100 may be implemented in a number of suitable ways to provide the auto-zero operations described herein. As such, the buffer circuit 100 should not be limited to the embodiments presented herein. Indeed, FIG. 7 illustrates an alternate embodiment of the buffer circuit 100 that may be employed with additional circuitry to enhance the operation of any suitable buffer circuit 100.

Figure 7:
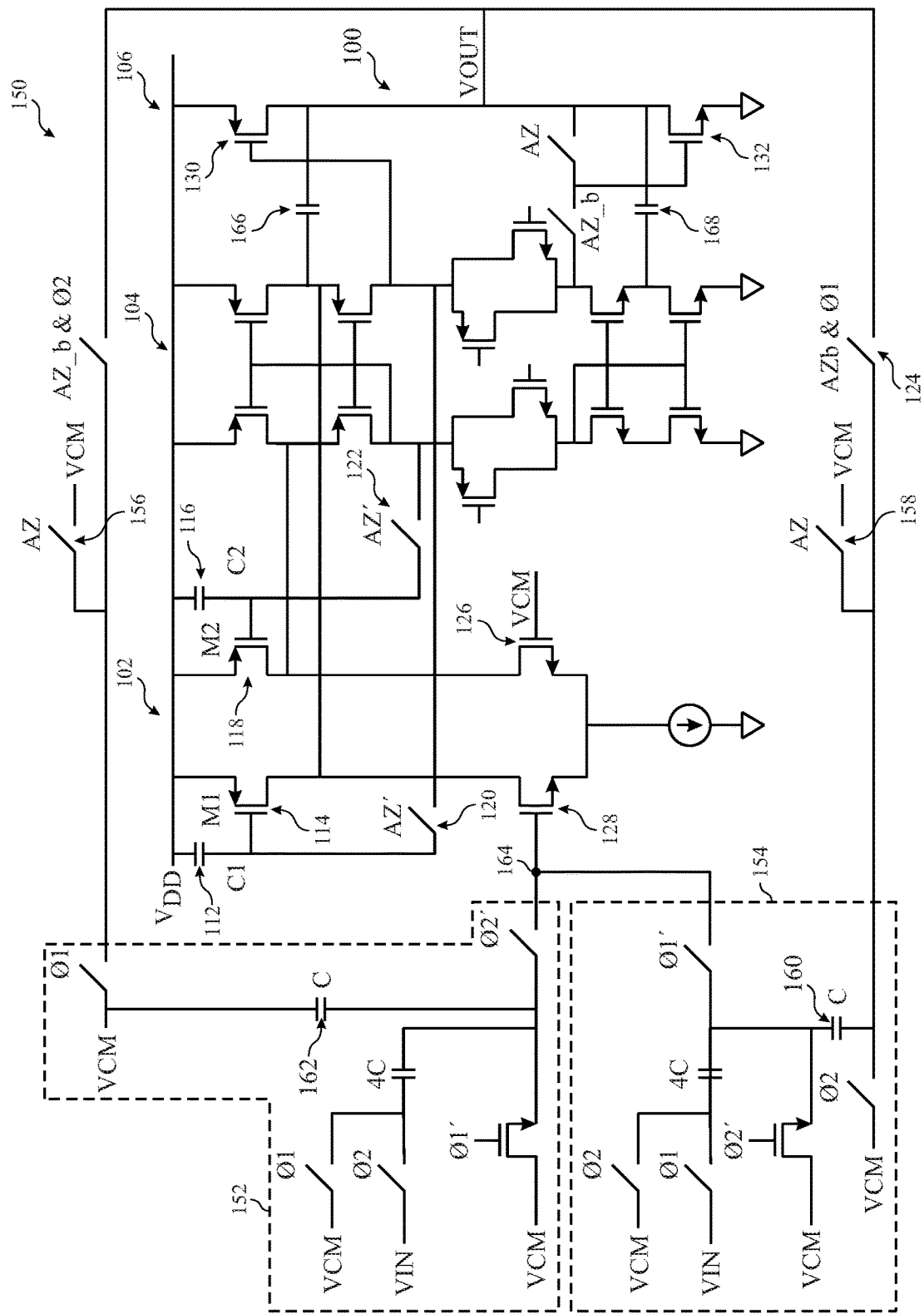
FIG. 7 is another circuit diagram of an alternate buffer circuit that may be part of the display of FIG. 5, in accordance with an embodiment.

Keeping the operation of the buffer circuit 100 of FIG. 6 in mind, an alternate buffer circuit is presented in FIG. 7 as part of a voltage multiplication buffer circuit 150 as shown in FIG. 7. Referring to the voltage multiplication buffer circuit 150 as shown in FIG. 7, the input voltage (VIN) may be amplified prior to being provided to the differential pair stage 102 of the buffer circuit 150. In this way the buffer circuit 150 may operate with lower input voltages, while producing higher output voltages for the output stage 106. As a result, the pixel circuitry may operate with lower voltage levels, thereby providing power savings across the electronic device 10.

Referring now to FIG. 7, the voltage multiplication buffer circuit 150 may include charge injection circuit 152 and charge injection circuit 154. By way of operation, during the auto-zero stage of operation (e.g., AZ stage) the charge injection circuits 152 and 154 may alternately connect the voltage input (VIN) to the switch 128, while the switch 126 is coupled to the common mode voltage (VCM) and while the switches 120 and 122 are closed. As such, one charge injection voltage provided from a supply dependent, corner dependent, and/or temperature dependent charge injection circuit (e.g., 152 or 154) is alternated with a similar supply dependent, corner dependent, and/or temperature dependent charge injection circuit (e.g., 154 or 152, respectively). Since the switches 120 and 122 are closed, the error due to the differences in the charge injection circuits 152 and 154 are stored on the capacitors 112 and 116, as well as the current errors of the differential pair stage 102, the cascade stage 104, and the output stage 106. In this way, the input voltages (VIN) amplified via the charge injection circuits 152 and 154 do not produce an offset that affects the operation of the buffer circuit 150.

Figure 8:
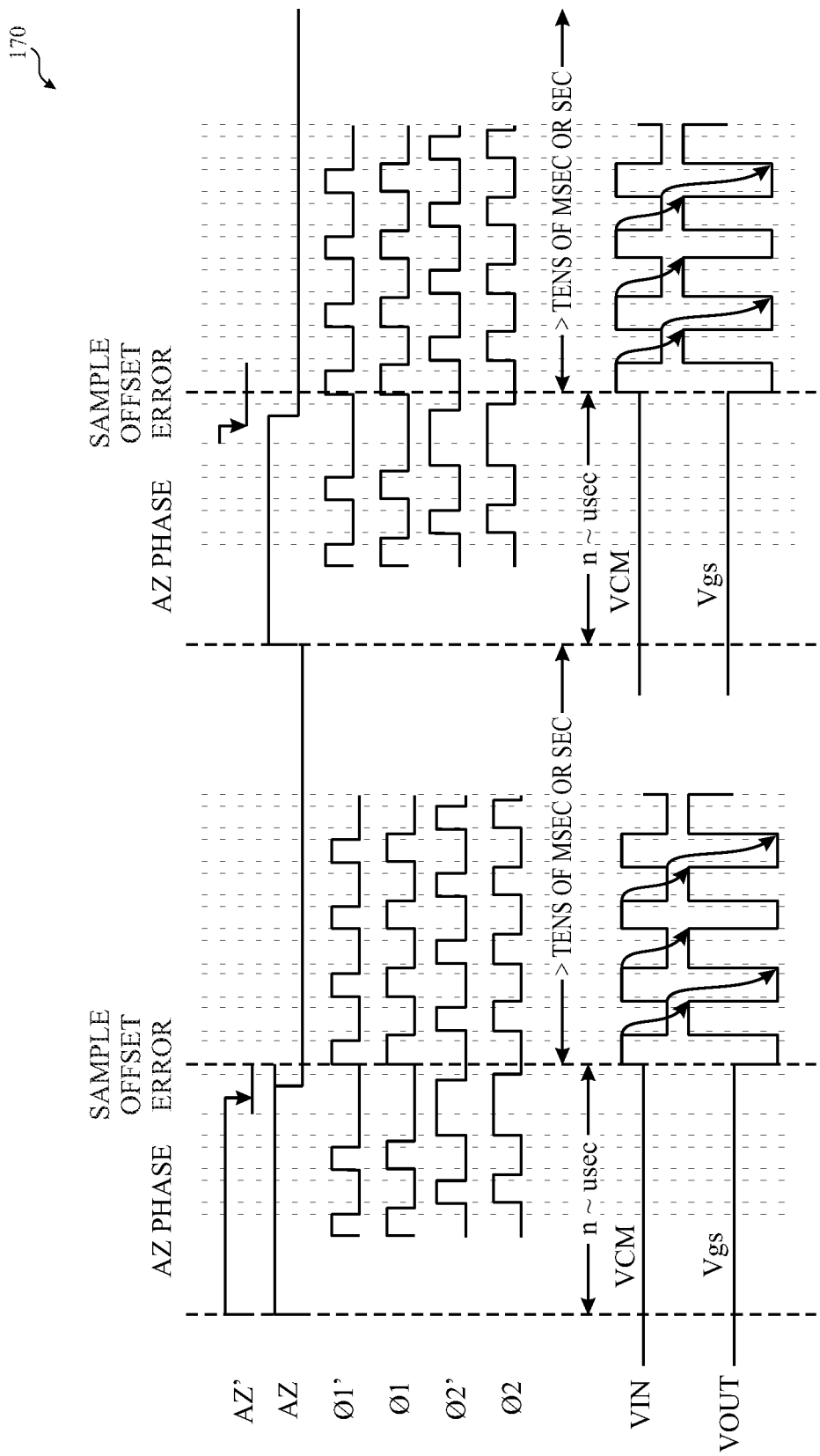
FIG. 8 is a timing diagram of an example operation of the buffer circuit of FIG. 7, in accordance with an embodiment.

Moreover, it should be noted that switches of the charge injection circuits 152 and 154 operate according to phase signals Ø1 and Ø2, which operate on opposite cycles. For example, FIG. 8 illustrates a timing diagram 170 for operating the voltage multiplication buffer circuit 150 of FIG. 7. As shown in the timing diagram 170, during the auto-zero phase (AZ phase), the input voltage provided to the switch 128 remains at the common mode voltage (VCM) because switches 156 and 158 are closed and coupled to the common mode voltage (VCM), thereby charging capacitors 160 and 162 to the common mode voltage (VCM). As such, the buffer circuit 150 may reset the pixel 82 between frames of image data.

After the auto-zero signals (e.g., AZ and AZ') are removed from the switches 120, 122, 156, and 158, the charge injection circuits 152 and 154 provide the input voltage (VIN) to the buffer circuit 150, such that the output stage 106 outputs an amplified voltage signal, as compared to the input voltage signal (VIN), as shown in the timing diagram 170 after time t1.

It should be noted that when the phase signals Ø1 and Ø1' are applied, the phase signals Ø2 and Ø2' are removed, thereby injecting the charge from the switches that received the phase signals Ø2 and Ø2' on a summing node 164. However, since the switches of the charge injection circuits 152 and 154 are matched (e.g., sized similarly) to each other, the error or offset injected into the summing node 164 from the switches that received the phase signals Ø2 and Ø2' may be absorbed by the switches that received the phase signals Ø1 and Ø1'. As a result, error or offsets are not introduced into the voltage output via the output stage 106.

It should be noted that the switches described above may be implemented using any suitable switching device and should not be limited the embodiments described above or illustrated in the figures. In addition, the control signals provided to the various switches described above may be provided via a control system, the controller 84, or any other suitable control device.

Referring back to FIGS. 6 and 7, it should be noted that the compensation capacitors 166 and 168 connected between the cascade stage 104 and the output stage 106 to provide a cascode compensation to better enable the buffer circuits 100 and 150 absorb kick-back voltages provided from a gamma bus due to data operations in power driver 26A, the image driver 86B, or the like. That is, when the buffer circuits 100 and 150 receive a kickback due to the operations of the source driver, the voltage output via the output stage 106 may settle faster in the presence of the kick-back voltage, as compared to connecting the compensation capacitors 166 and 168 in a different manner.

Figure 9:
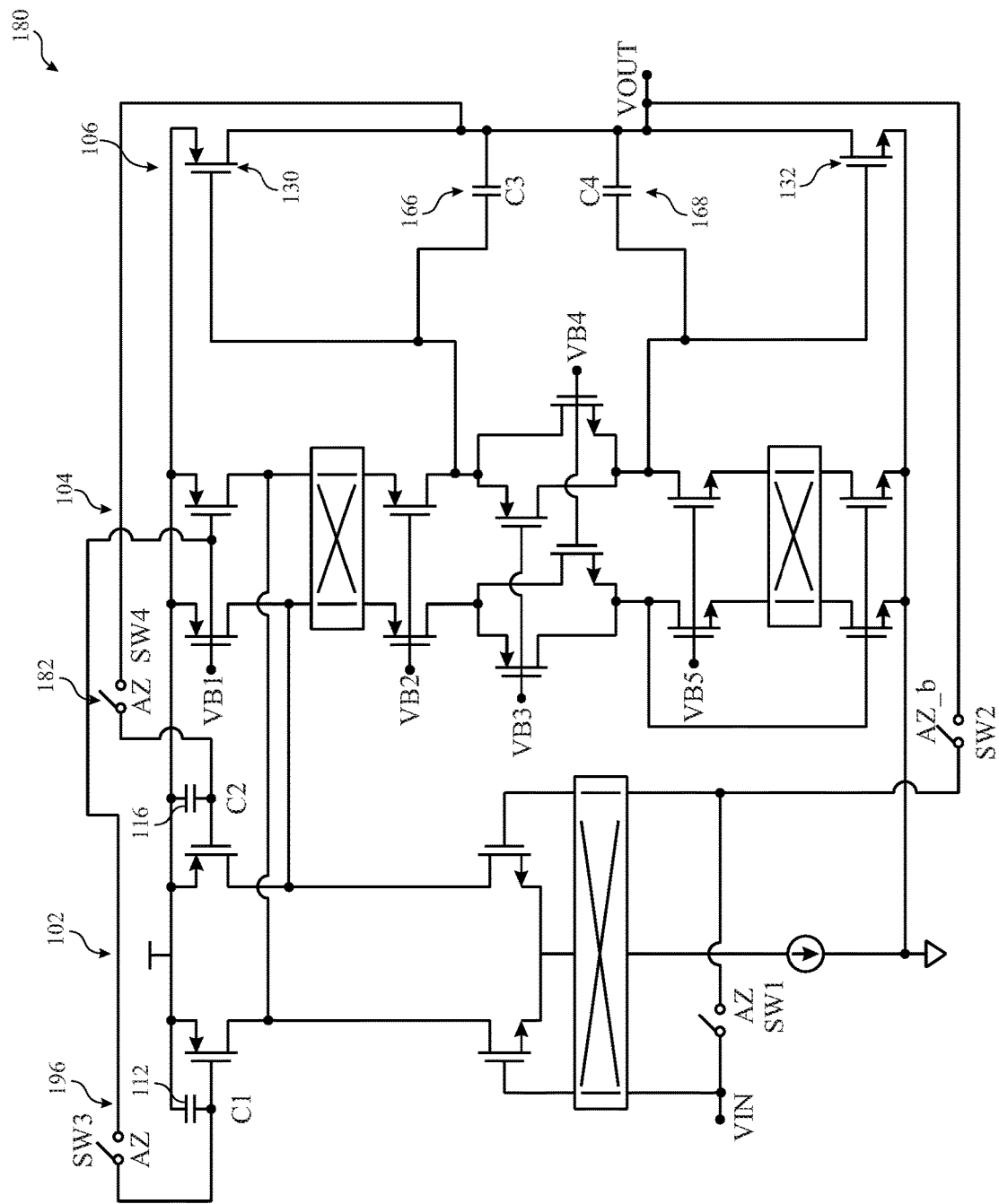
FIG. 9 is another embodiment of a buffer circuit in which capacitors are connected to an output stage after a cascade stage, in accordance with an embodiment.

For example, FIG. 9 illustrates another embodiment of a buffer circuit 180 in which the capacitors 166 and 168 are connected to the output stage 106 after the cascade stage 104. The buffer circuit 180 includes a feedback loop that connects the capacitor 116 (e.g., auto-zero holding capacitor) to the voltage output of the output stage 106 via the switch 182 during the auto-zero phase of operation. Since the gates of the switches 130 and 132 are coupled to the compensation capacitors 166 and 168, respectively, the voltage output by the output stage 106 reacts to the voltage output by the cascade stage 104 in approximately a 1:1 ratio (e.g., unity gain). In this way, the auto-zero operation may take a certain amount of time for the voltage output by the output stage 106 to settle.

Figure 10:
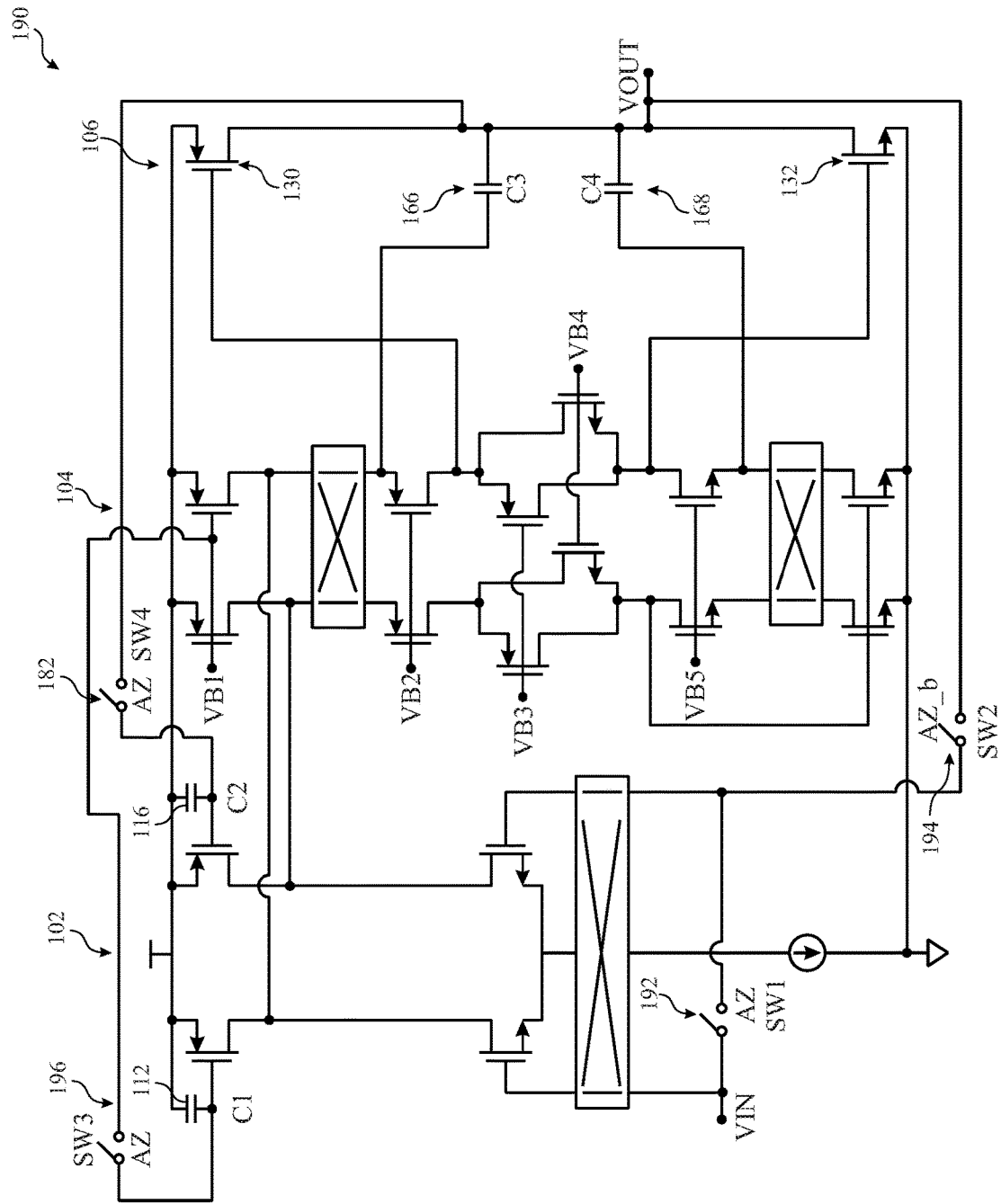
FIG. 10 is another embodiment of a buffer circuit in which capacitors are connected to a cascade stage, in accordance with an embodiment.

By contrast, by coupling the compensation capacitors 166 and 168 to the cascade stage 104, as shown in a buffer circuit 190 of FIG. 10, the gates of the switches 130 and 132 are coupled to the output of the cascade stage 104, which includes the amplified signal associated with the difference output by the differential pair stage 102. As a result, the voltage output by the output stage 106 reacts to the voltage output by the cascade stage 104 in a larger magnitude than the 1:1 ratio performed in the buffer circuit 180. In this way, the auto-zero operation may take less time for the voltage output by the output stage 106 to settle using the buffer circuit 190, as compared to the amount of time for the voltage output by the output stage 106 to settle using the buffer circuit 180.

Keeping this in mind and assuming that the AZ clock signal and the AZ_b clock signal are non-overlapping inverted clock signals, the buffer circuit 190 may operate as follows. During the auto-zero phase of operation (e.g., AZ clock signal), the voltage output (VOUT) of the buffer circuit 190 is connected to the capacitor 116 (e.g., auto-zero holding capacitor) via the switch 182, while the inputs of the differential-pair stage 102 are shorted with the switch 192. In addition, switch 196 may be used to sample the capacitor 112 to a bias voltage (VB1) provided to the cascade stage 104. Since the differential-pair stage 102 is shorted, a switch charge injection from the operation of the switch 122 connecting the capacitor 116 to the voltage output of the output stage 106 may be canceled. During the non-AZ operation phase (e.g., AZ_b), the offset between the voltage output (VOUT) and the input voltage (VIN) is sampled to the capacitor 116, and both capacitors 112 and 116 float when the switch 192 opens. At the same time, a feedback switch 194 closes the buffer circuit 190 in a closed loop.

As a result of employing the buffer circuit 190, the differential-pair stage 102 does not use frequent auto-zero assertions because the capacitors 112 and 116 are refreshed by a ping-pong approach. Indeed, a duplicated pre-Amp circuit is not involved for this ping-pong operation and a pseudo differential capacitor is also not employed. Moreover, a charge injection from the switches 196 and 182 are canceled by the auto-zero phase of operation in the differential-pair stage 102 and the sample and hold feature is preserved for the buffer circuit 190.

Additionally, by employing the cascode compensation depicted in the buffer circuit 190, the present embodiment enhances a gamma settling time and provides a better visual outcome. That is, for example, when presenting an image with alternating gray colors per line image (e.g., black and white horizontal strips), the buffer circuit 190 may produce changes between frames of image data that are less visible by a user. Further, a large resistor-capacitor loading kick-back from the output may not result in a change in the input voltage.

Figure 11:
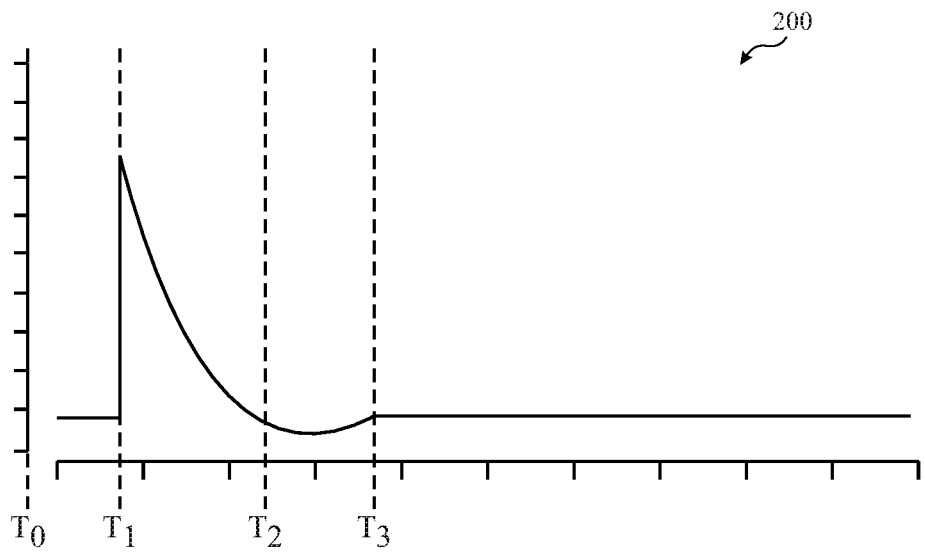
FIG. 11 is a voltage waveform that correspond to settling times for voltage output by buffer circuit of FIG. 9, in accordance with an embodiment.
Figure 12:
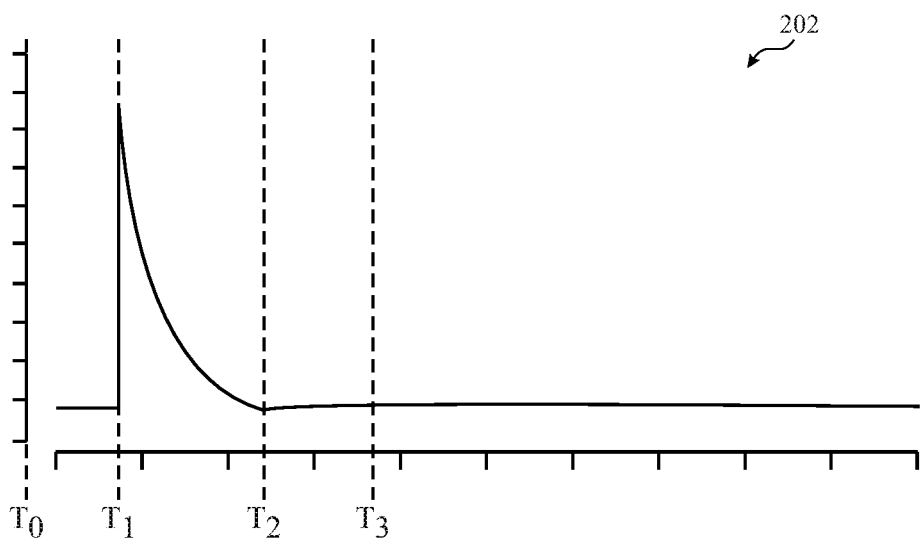
FIG. 12 is a voltage waveform that correspond to settling times for voltage output by buffer circuit of FIG. 10, in accordance with an embodiment.

To better visualize the improved settling time of the voltage output by the buffer circuit 180 as compared to the buffer circuit 190, FIGS. 11 and 12 illustrate voltage waveforms 200 and 202 that correspond to the settling times of the buffer circuit 180 and the buffer circuit 190, respectively. Referring to FIGS. 11 and 12, an output disturbance, such as a kick-back voltage, may be received at time t1. Since the disturbance will be gained up by applying a higher gain to the gate of the output devices in the buffer circuit 190, the voltage waveform 202 collapses faster as compared to the voltage waveform 200 between times t1 and t2. Indeed, by time t2 in the voltage waveform 202, the voltage has settled, while the voltage waveform 200 does not settle until time t3. Moreover, the buffer circuit 190 operates to prevent the voltage waveform 202 from undershooting the desired voltage output, as compared to the voltage waveform 200 between times t2 and t3, due to a slew rate limitation of the buffer circuit 190.

Figure 13:
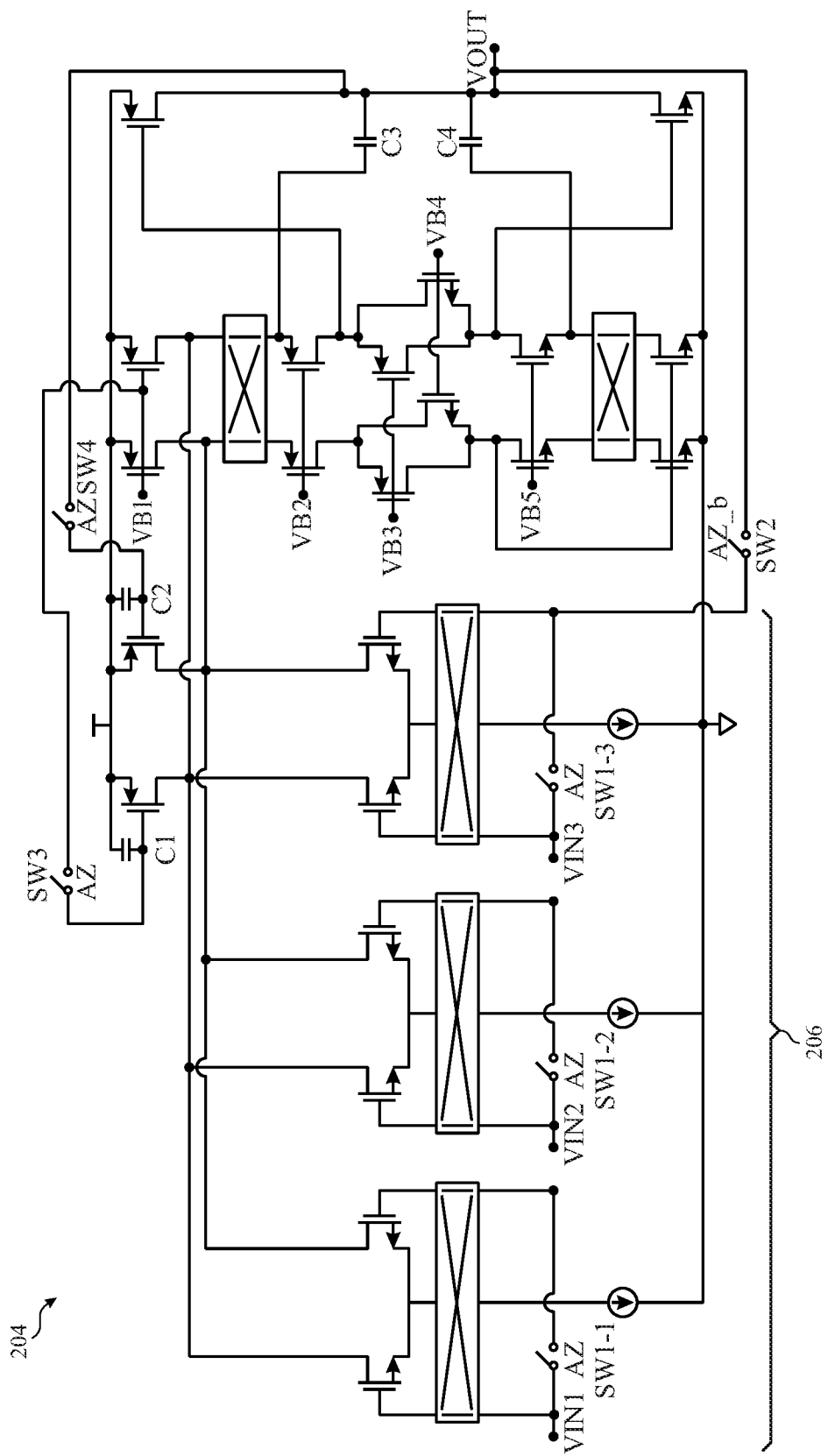
FIG. 13 is another embodiment of a buffer circuit that includes input interpolation circuitry, in accordance with an embodiment.

With the foregoing in mind, it should be noted that the buffer circuit 190 is not limited to the embodiment presented in FIG. 10. Indeed, the buffer circuit 190 may be implemented in any suitable manner. For example, FIG. 13 illustrates a buffer circuit 204 that includes input interpolation circuitry 206. In some embodiments, the interpolation circuitry 206 may be used to generate a more precise input voltage. That is, by splitting the input into three as shown in FIG. 13, the buffer circuit 204 may produce a more precise output voltage by tuning the input voltage, such that a particular portion of the interpolation circuitry 206 is weighed higher than others.

By way of operation, when using an interpolating differential pair (e.g., interpolation circuitry 206), the auto-zero operation may be implemented by shorting each differential pair leg of the interpolation circuitry 206. The auto-zero operation may remove the threshold voltage and load current mismatch that occurs with using interpolating differential pairs. In addition, the native transistors used in the differential pair allows rail-to-rail input and output voltage range. In some embodiments, chopping may be used simultaneously with the auto-zero operation to remove kT/C noise, which corresponds to total thermal noise power added to a signal when a sample is taken on a capacitor, from sampling and a residual offset.

Figure 14:
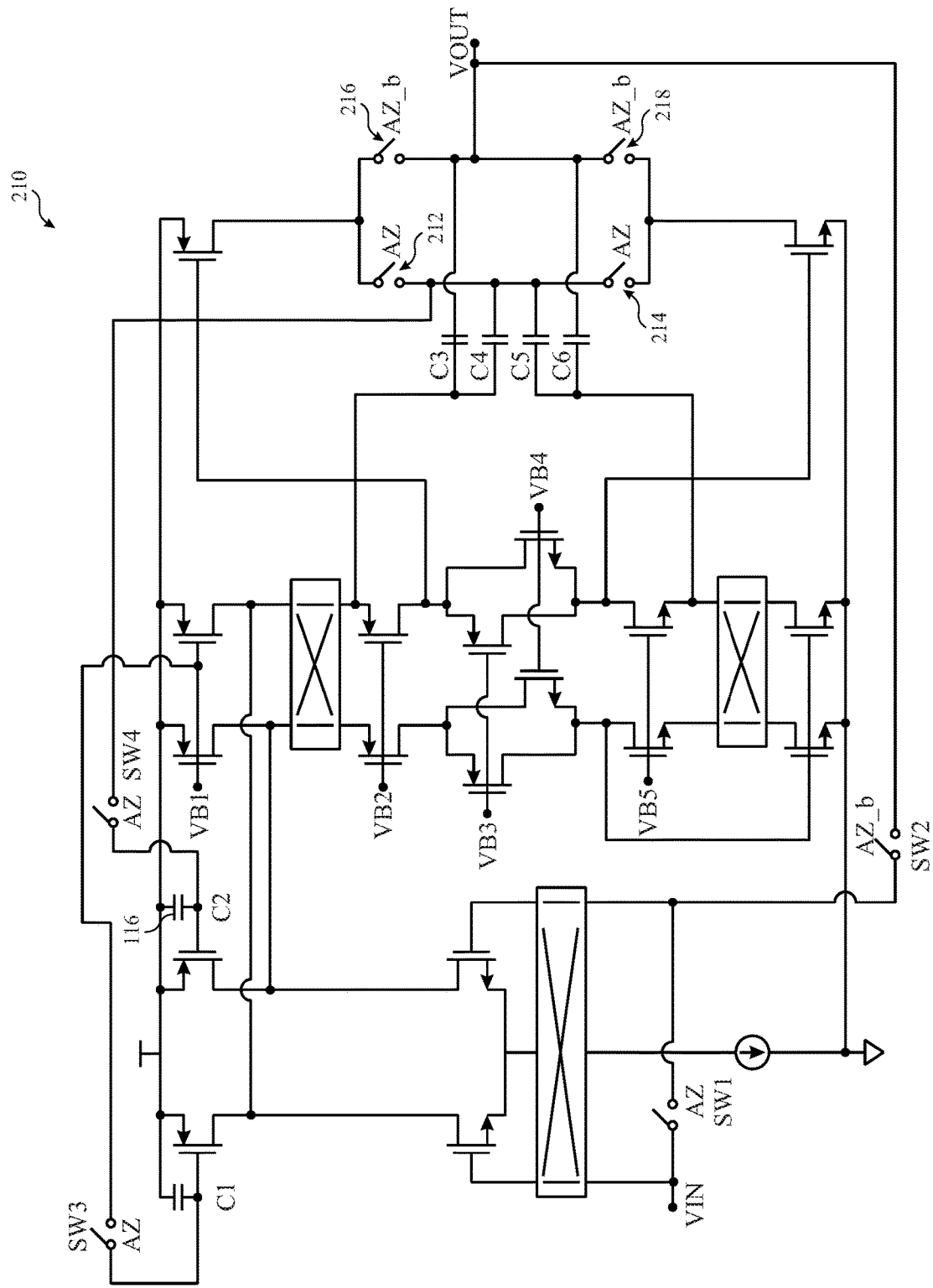
FIG. 14 is another embodiment of a buffer circuit that includes an output stage that has two separate branches, in accordance with an embodiment.

In some embodiments, the output stage may be separated into multiple branches. For instance, FIG. 14 illustrates a buffer circuit 210 that includes an output stage that has two separate branches. In the buffer circuits described above, the output is floated during the auto-zero phase of operation. The buffer circuit 210 connects the output of the buffer circuit 210 to auto-zero holding capacitor 116 (C2). During the auto-zero phase of operation, stability compensation cap becomes C4 and C5, instead of C3 and C6, based on the operation of switches 212, 214, 216, and 218.

During the inverse auto-zero phase of operation, the buffer circuit 210 is connected as a unity gain buffer and the output loading is compensated with capacitors C3 and C6. In this way, the buffer circuit 210 may be tuned for stability for load conditions with the capacitor 116 and the output voltage. The output voltage (VOUT) is floating during the auto-zero phase of operation, but the output voltage (VOUT) becomes near the bias voltage (VB1) plus the offset. Since the voltage output (VOUT) would remember the previous input voltage (VIN), the buffer circuit 210 limits an amount of power consumed in discharging and charging the voltage output (VOUT), while the voltage output (VOUT) remains about the same voltage as the input voltage (VIN). As a result, the buffer circuit 210 may improve stability during the auto-zero phase of operation, the auto-zero settles more quickly under no load conditions. Moreover, the buffer circuit 210 is insensitive to load conditions and floats the output voltage, instead of clamping it to the bias voltage (VB1) during the auto-zero phase of operation. As a result, the buffer circuit 210 maintains the output voltage when a capacitor loading exceeds a threshold. In addition, the buffer circuit 210 may be insensitive to load conditions and thus become a good option for running auto-zero operations when testing with large loads of test multiplexers (MUX).

Figure 15:
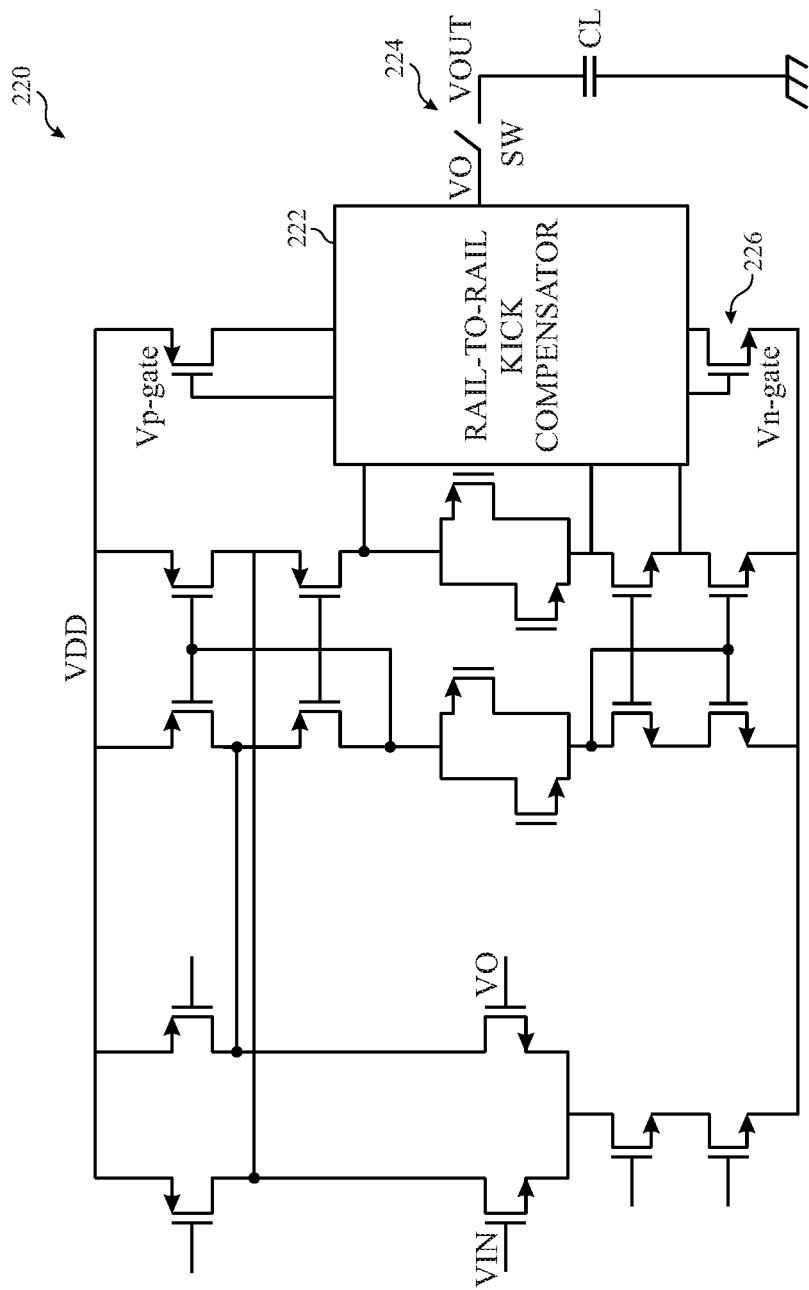
FIG. 15 is another embodiment of a buffer circuit that includes a kick compensator circuit, in accordance with an embodiment.
Figure 16:
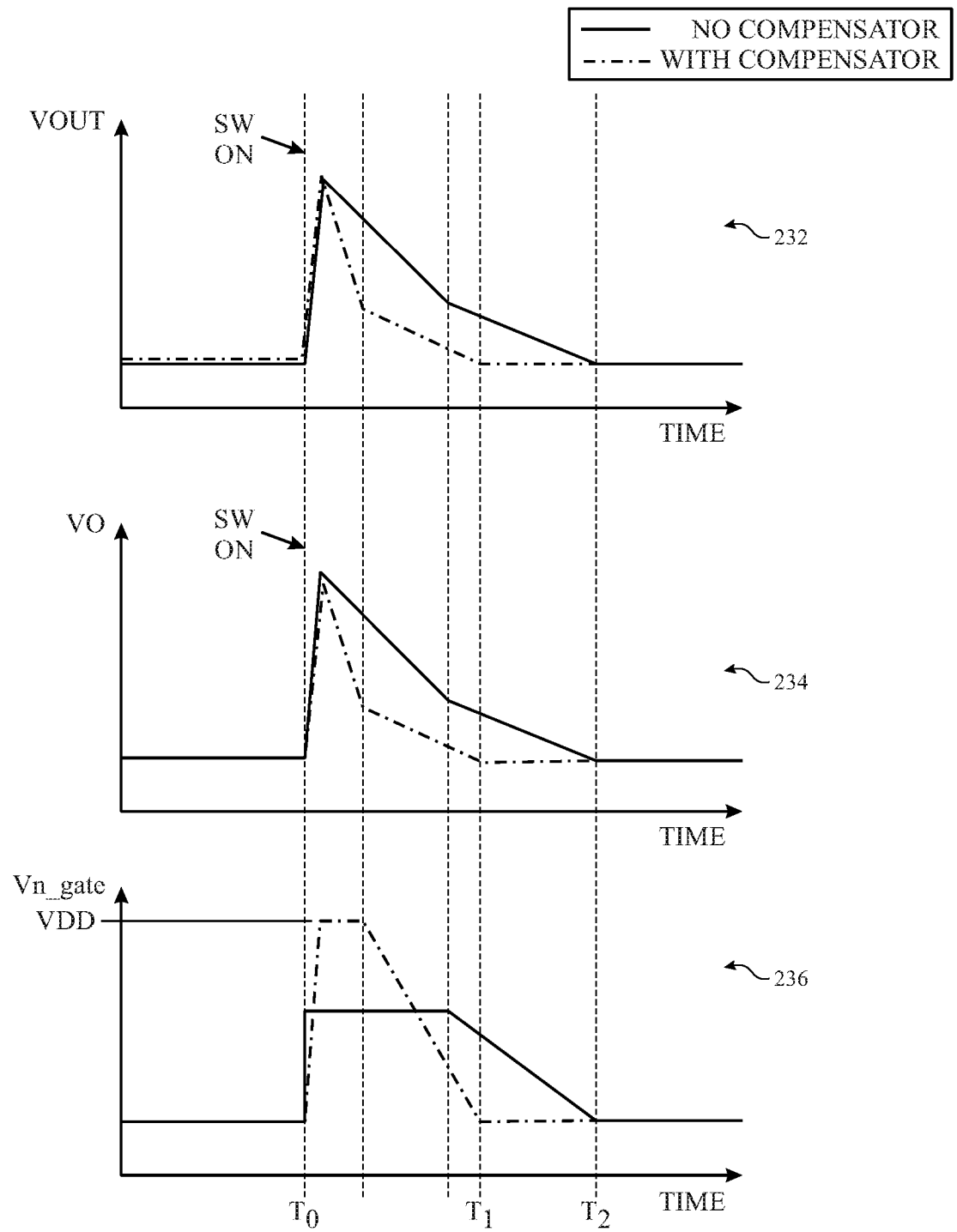
FIG. 16 is a collection of voltage waveforms that correspond to the operation of the buffer circuit of FIG. 15, in accordance with an embodiment.

Although FIG. 10 illustrates one embodiment of a buffer circuit that can compensate for voltage kickbacks, it should be noted that the compensation portion of the buffer circuit may be implemented in other manners. For example, FIG. 15 illustrates an example buffer circuit 220 that includes a rail-to-rail kick compensator circuit 222. To better illustrate how the kick compensator circuit 222 may reduce the amount of time for the output voltage (VOUT) to return to zero, FIG. 16 illustrates voltage waveforms 232, 234, and 236 that correspond to voltages after switch 224, before switch 224, and at a gate of switch 226. The switch 224 may close at time t0 and shortly thereafter the voltage output (VOUT) may decrease and return to zero at time t1, as opposed to time t2 for buffer circuits without the kick compensator circuit 222. In this way, the output disturbance that causes the voltage kickback may be aggressively gained up and applied to the gate of the output device in the voltage kick compensator circuit 222 to improve the slew rate of the voltage (VO) applied to the switch 224. As a result, the voltage output (VOUT) of the buffer circuit 220 may recover faster than circuits that do not include the voltage kick compensator circuit 222.

Figure 17:
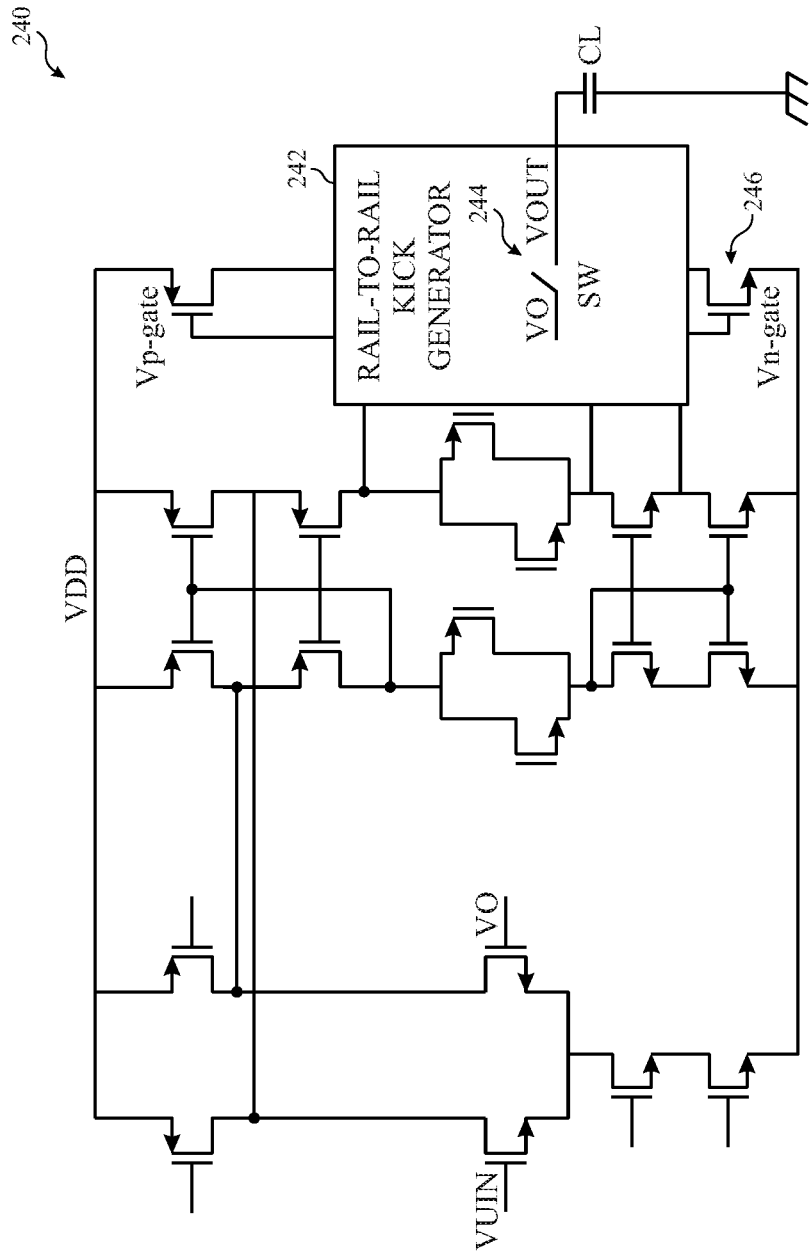
FIG. 17 is another embodiment of a buffer circuit that includes a kick generator circuit, in accordance with an embodiment.

In some embodiments, the input voltage provided to the buffer circuits described above may still change without an output disturbance. To compensate for these changes, FIG. 17 illustrates an example buffer circuit 240 that includes a rail-to-rail kick generator circuit 242. To better illustrate how the kick generator circuit 242 may reduce the amount of time for the output voltage (VOUT) to return to zero, FIG. 18 illustrates voltage waveforms 252, 254, and 256 that correspond to voltages after switch 244, before switch 244, and at a gate of switch 246. In response to detecting the movement or varying voltages in the input voltage, the buffer circuit 240 may use the kick generator circuit 242 to intentionally generate an output disturbance by asserting an off-state isolation switch using the switch 244. The output disturbance may be applied to a gate of the switch 246 to improve the slew behavior of the voltage output (VOUT).

Figure 18:
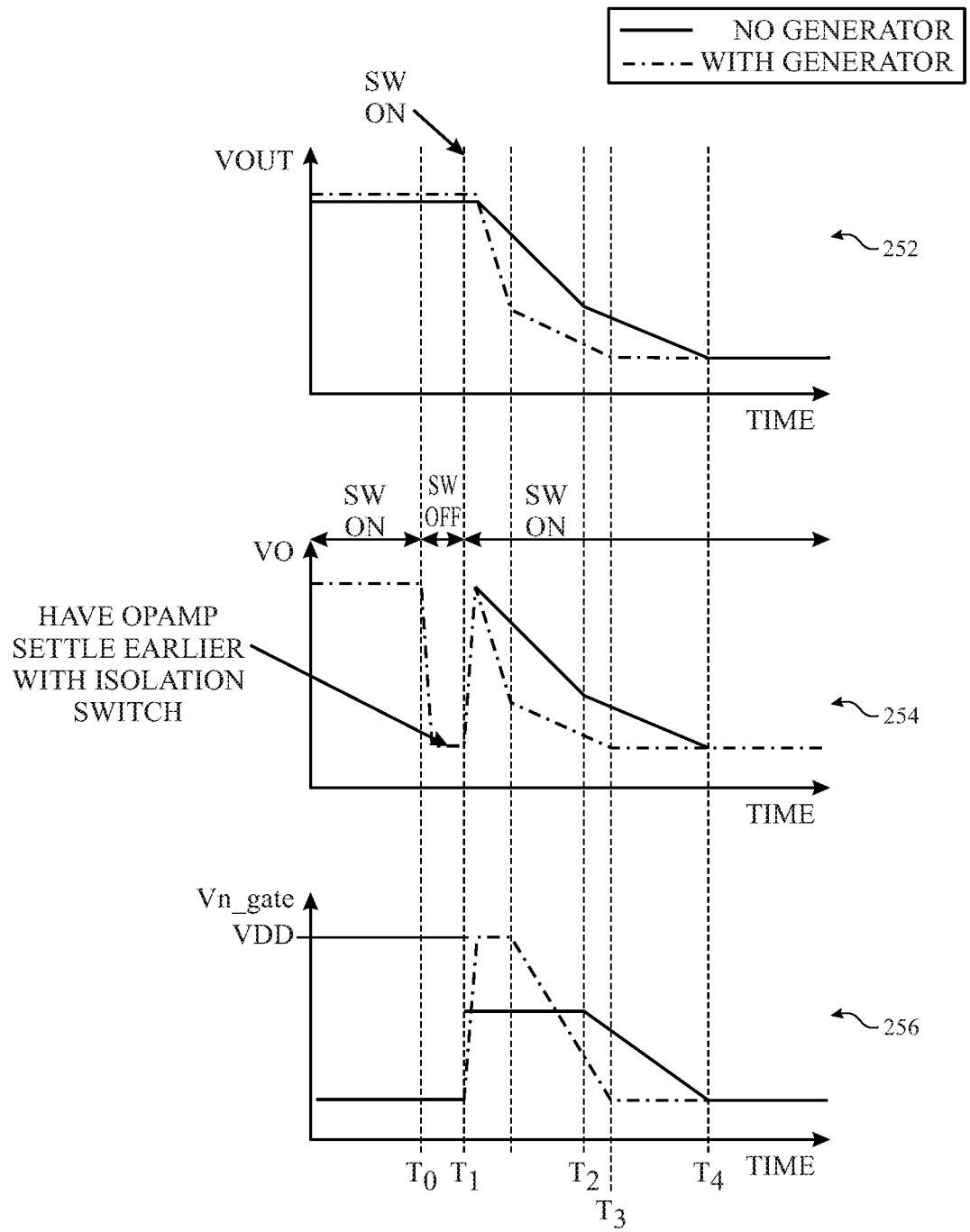
FIG. 18 is a collection of voltage waveforms that correspond to the operation of the buffer circuit of FIG. 17, in accordance with an embodiment.

For example, referring to the voltage waveforms 252, 254, and 256 of FIG. 18, the switch 244 may initially be closed to allow the buffer circuit 240 to output the voltage output (VOUT). At time t0, the switch 244 may open between times t0 and t1 to intentionally generate the output disturbance. Shortly thereafter, the voltage output (VOUT) may begin to decrease and return to zero by time t3, as opposed to time t4 for buffer circuits without the kick generator circuit 242. In this way, the output disturbance that causes the voltage kickback may be aggressively gained up and applied to the gate of the output device in the voltage kick generator circuit 242 to improve the slew rate of the voltage (VO) applied to the switch 244. As a result, the voltage output (VOUT) of the buffer circuit 220 may recover faster than circuits that do not include the voltage kick generator circuit 242.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f).

However, for any claims containing elements designated in any other manner, it is intended that such elements are not to be interpreted under 35 U.S.C. 112(f).

What is claimed is:

1. A system, comprising:
a pixel of a plurality of pixels, wherein the pixel is configured to emit light based on a voltage signal provided to the pixel;
a buffer circuit comprising a differential pair stage, a cascade stage, and an output stage, wherein the differential pair stage is coupled to the cascade stage, wherein the cascade stage is coupled to the output stage, and wherein the differential pair stage is configured to:
receive a common mode voltage signal via a first switch in response to the first switch receiving a first signal configured to cause the first switch to close;
couple at least one capacitor to the output stage via a second switch configured to operate based on a second signal, wherein the at least one capacitor is configured to reduce an offset provided by one or more circuit components in the differential pair stage, the cascade stage, the output stage, or any combination thereof; and
couple a voltage source to the pixel via the output stage in response to the first signal being present.

2. The system of claim 1, comprising a third switch configured to couple an additional capacitor to a gate of a fourth switch in response to receiving the first signal.

3. The system of claim 2, wherein the second switch and the third switch are matched with each other.

4. The system of claim 1, comprising:
a third switch configured to couple an input voltage to the differential pair stage in response to the first signal not being present; and
a fourth switch configured to couple an output of the output stage to the differential pair stage in response to the first signal not being present.

5. The system of claim 1, wherein the first signal is provided during a vertical blanking interval.

6. The system of claim 1, wherein the at least one capacitor is coupled to a respective gate of a respective PMOS switch and a voltage source.

7. The system of claim 6, wherein each respective PMOS switch is coupled to the voltage source.

8. A buffer circuit, comprising:
a differential pair stage, a cascade stage, and an output stage, wherein the differential pair stage is coupled to the cascade stage, wherein the cascade stage is coupled to the output stage, and wherein the differential pair stage is configured to:
receive a common mode voltage signal via a first switch in response to the first switch receiving a first signal configured to cause the first switch to close;
couple at least one capacitor to the output stage via a second switch configured to operate based on a second signal, wherein the at least one capacitor is configured to reduce an offset provided by one or more circuit components in the differential pair stage, the cascade stage, the output stage, or any combination thereof; and
couple a voltage source to a pixel via the output stage in response to the first signal being present.

9. The buffer circuit of claim 8, wherein the second signal is provided to the second switch before the first signal is provided to the first switch.

10. The buffer circuit of claim 8, wherein the first signal and the second signal are inverse waveforms of each other.

11. The buffer circuit of claim 8, comprising a first feedback line configured to couple the output stage to a first charge injection circuit configured to provide a first input voltage to the differential pair stage.

12. The buffer circuit of claim 11, comprising a second feedback line configured to couple the output stage to a second charge injection circuit configured to provide a second input voltage to the differential pair stage.

13. The buffer circuit of claim 12, wherein the first charge injection circuit and the second charge injection circuit operate at opposite cycles.

14. The buffer circuit of claim 8, comprising a first capacitor and a second capacitor, wherein the first capacitor and the second capacitor are coupled directly between the cascade stage and the output stage.

15. The buffer circuit of claim 14, comprising a third capacitor electrically coupled in parallel with the first capacitor and a fourth capacitor electrically coupled in parallel with the second capacitor.

16. The buffer circuit of claim 8, comprising interpolation circuitry configured to tune the common mode voltage via two or more legs of the interpolation circuitry.

17. The buffer circuit of claim 8, comprising a voltage compensation circuit coupled to the output stage, wherein the voltage compensation circuit is configured to increase a gain associated with the output stage in response to detecting an output disturbance.

18. The buffer circuit of claim 8, comprising a voltage generator circuit coupled to the output stage, wherein the voltage generator circuit is configured to increase a gain associated with the output stage in response to detecting varying input voltage provided to the differential pair stage.

19. A method, comprising:
receiving, via a buffer circuit, a common mode voltage signal via a first switch in response to the first switch receiving a first signal configured to cause the first switch to close;
coupling, via the buffer circuit, at least one capacitor to an output stage of the buffer circuit via a second switch configured to operate based on a second signal, wherein the at least one capacitor is configured to reduce an offset provided by one or more circuit components in a differential pair stage of the buffer circuit, a cascade stage of the buffer circuit, the output stage of the buffer circuit, or any combination thereof, wherein the differential pair stage is coupled to the cascade stage, and the cascade stage is coupled to the output stage; and
coupling, via the buffer circuit, a voltage source to a pixel via the output stage in response to the first signal being present.

20. The method of claim 19, comprising coupling, via the buffer circuit, a feedback line from the output stage to the differential pair stage via a third switch.

* * * * *